(12) United States Patent
Lai et al.

(10) Patent No.: US 12,506,090 B2
(45) Date of Patent: Dec. 23, 2025

(54) SEMICONDUCTOR PACKAGE INCLUDING STRESS BUFFERS AND METHODS OF FORMING THE SAME

(71) Applicant: Taiwan Semiconductor Manufacturing Company Limited, Hsinchu (TW)

(72) Inventors: Po-Chen Lai, Hsinchu (TW); Ming-Chih Yew, Hsinchu (TW); Chin-Hua Wang, New Taipei (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 539 days.

(21) Appl. No.: 17/852,615

(22) Filed: Jun. 29, 2022

(65) Prior Publication Data

US 2024/0006340 A1 Jan. 4, 2024

(51) Int. Cl.
*H01L 23/00* (2006.01)
*H01L 21/48* (2006.01)
*H01L 23/13* (2006.01)
*H01L 23/14* (2006.01)
*H01L 23/498* (2006.01)
*H01L 25/065* (2023.01)

(52) U.S. Cl.
CPC ........ *H01L 23/562* (2013.01); *H01L 21/4846* (2013.01); *H01L 23/13* (2013.01); *H01L 23/145* (2013.01); *H01L 23/49833* (2013.01); *H01L 23/49838* (2013.01); *H01L 24/16* (2013.01); *H01L 24/32* (2013.01); *H01L 24/73* (2013.01); *H01L 23/49811* (2013.01); *H01L 23/49816* (2013.01); *H01L 23/49822* (2013.01); *H01L 25/0655* (2013.01); *H01L 2224/10165* (2013.01); *H01L 2224/16227* (2013.01); *H01L 2224/16238* (2013.01); *H01L 2224/32225* (2013.01); *H01L 2224/73204* (2013.01); *H01L 2924/3512* (2013.01)

(58) Field of Classification Search
CPC ....... H01L 2221/68345; H01L 23/5385; H01L 24/29; H01L 24/92; H01L 24/83; H01L 21/563
See application file for complete search history.

(56) References Cited

U.S. PATENT DOCUMENTS

2021/0125885 A1* 4/2021 Chen ................. H01L 24/20

* cited by examiner

*Primary Examiner* — Samuel A Gebremariam
(74) *Attorney, Agent, or Firm* — The Marbury Law Group, PLLC

(57) ABSTRACT

A semiconductor package includes a package substrate; a semiconductor die vertically stacked on the package substrate; a redistribution layer (RDL) including a dielectric material and metal features that electrically connect the semiconductor die to the package substrate, the RDL having a first Young's modulus; a first underfill layer disposed between the RDL and the semiconductor die; and stress buffers embedded in the RDL below corners of the semiconductor die, each stress buffer having a second Youngs modulus that is at least 30% less than the first Youngs modulus.

20 Claims, 10 Drawing Sheets

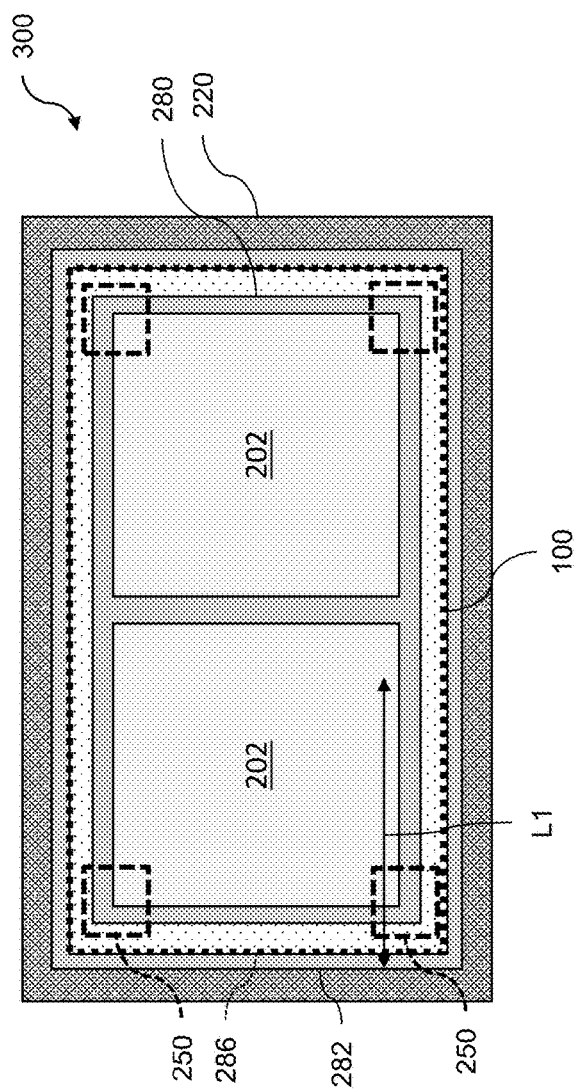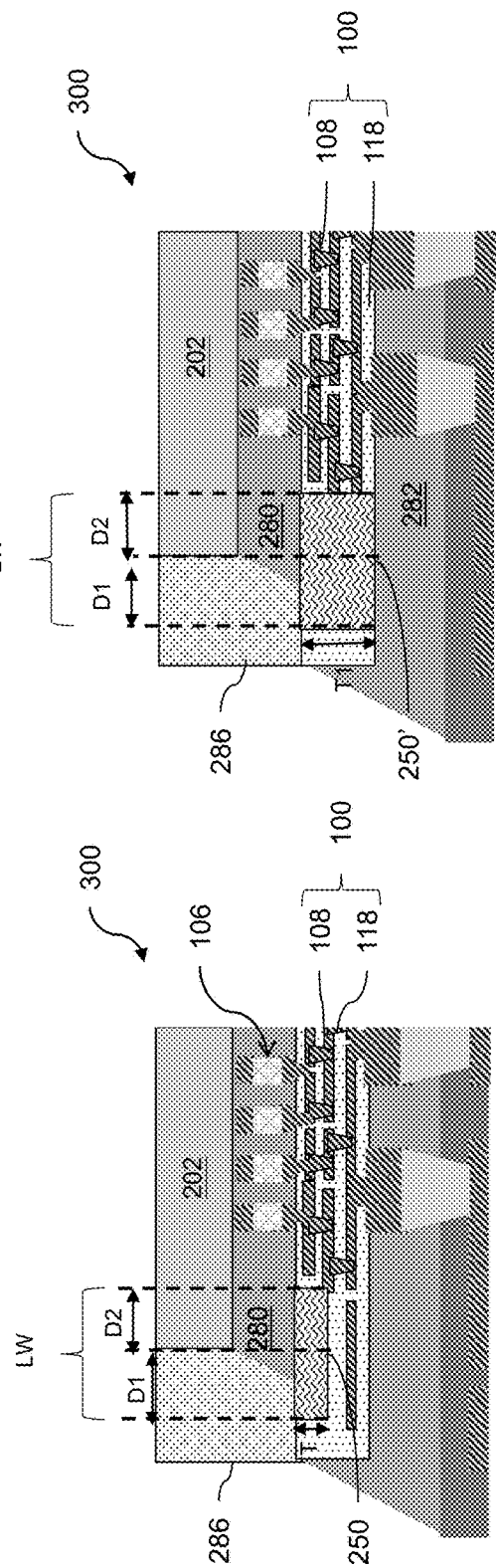

SEMICONDUCTOR PACKAGE INCLUDING STRESS BUFFERS AND METHODS OF FORMING THE SAME

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these 3D devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7B is a top view of the semiconductor package of FIG. 7A.

FIG. 8A is a partial cross-sectional view taken along line L1 of FIG. 7B.

FIG. 8B is a cross-sectional view showing a modified stress buffer that may be included in the semiconductor package of FIG. 7A, according to various embodiments of the present disclosure.

DETAILED DESCRIPTION

Figure 1:
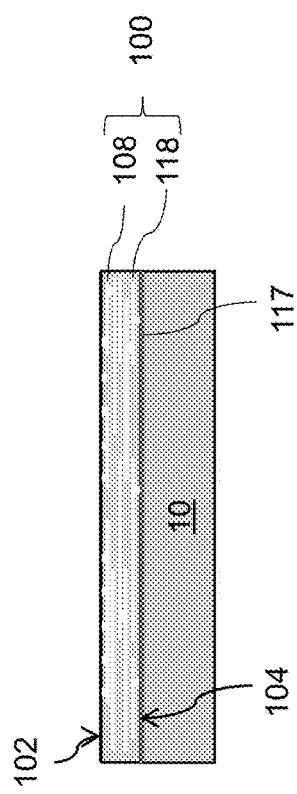
FIG. 1 is a vertical cross-section view of an intermediate structure during a process of forming a semiconductor package including an organic interposer located over a first carrier substrate according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package a number of semiconductor integrated circuit (IC) dies (i.e., "chips") may be mounted onto a common substrate, which may also be referred to as a "package substrate." In some packages, such as in a fan out wafer level package (FOWLP) and/or fan-out panel level package (FOPLP), a plurality of semiconductor IC dies may be mounted to an interposer, such as an organic interposer or a semiconductor (e.g., silicon) interposer, that may include interconnect structures extending therethrough. The resulting package structure, including the interposer and the semiconductor IC dies mounted thereon, may then be mounted onto a surface of a package substrate using solder connections. An underfill layer may be provided in the space between the interposer and the package substrate to encapsulate the solder connections and improve the structural coupling between the interposer and the package substrate. Generally, the methods and structures of the present disclosure may be used to provide a chip package structure such as a FOWLP and fan-out panel level package (FOPLP). While the present disclosure is described using an FOWLP configuration, the methods and structures of the present disclosure may be implemented in an FOPLP configuration or any other package configuration.

In related semiconductor packages, the coefficient of thermal expansion (CTE) differences among the various components contained in a semiconductor package may result in high amounts of thermo-mechanical stress, which may result in the formation of cracks and/or dislocations. Accordingly, various embodiments are disclosed herein to provide semiconductor packages that include components configured to reduce the amount of thermo-mechanical stress applied to the semiconductor packages.

FIG. 1 is a vertical cross-section view of an intermediate structure formed during a process of forming a semiconductor package, according to various embodiments of the present disclosure. Referring to FIG. 1, the intermediate structure includes a first carrier substrate 10 and a redistribution layer (RDL) 100 (or an interposer 100) formed on a first side of the first carrier substrate 10. The first carrier substrate 10 may provide mechanical support to the RDL 100, and may be formed of a suitable substrate material, such as glass material, a ceramic material (e.g., a sapphire substrate), a semiconductor material (e.g., a silicon substrate), or the like. Other suitable materials for the first carrier substrate 10 are within the contemplated scope of disclosure. In some embodiments, the first carrier substrate 10 may be formed of an optically transparent material.

In some embodiments, a first release layer 117 may be located over the first side of the first carrier substrate 10, and the RDL 100 may be located over the first release layer 117. The first release layer 117 may include an adhesive material that may adhere the RDL 100 to the first carrier substrate 10. In some embodiments, the first release layer 117 may include an adhesive material that may be subsequently treated to cause the adhesive material of the first release layer 117 lose its adhesive properties, such that the first carrier substrate 10 may be separated from the RDL 100. In some embodiments, the adhesive material of the first release layer 117 may lose its adhesive properties when subjected to treatment using an energy source, such as a thermal, optical (e.g., UV, laser, etc.) and/or sonic (e.g., ultrasonic) energy source. In one non-limiting example, the first release layer 117 may include a light-to-heat conversion (LTHC) material that may selectively absorb optical radiation in certain wavelength range(s), such as ultraviolet radiation, causing the LTHC material to heat up and thereby lose adhesion. In other embodiments in which the first carrier substrate 10 is formed of an optically transparent material, the application of an optical energy source may cause the first release layer 117 to lose its adhesive property. Alternatively, the first release layer 117 may include an adhesive material, such as an acrylic pressure-sensitive adhesive material, that may decompose when subjected to an elevated temperature. Other suitable materials for the first release layer 117 are within the contemplated scope of disclosure.

Referring again to FIG. 1, the RDL 100 may include a first side 102 and a second side 104 opposite the first side 102. The second side 104 of the RDL 100 may face the first carrier substrate 10. Metal features 108 (e.g., metal lines and vias) may extend within the RDL 100 between the first side 102 and the second side 104 of the RDL 100. The metal features 108 may be formed in and surrounded by an insulating matrix that may be formed of a dielectric material 118. The metal features 108 of the RDL 100 may be configured to route electrical signals between semiconductor integrated circuit (IC) dies and a package substrate in a semiconductor package to be subsequently formed. Thus, the metal features 108 may also be referred to as "redistribution structures."

In some embodiments, the RDL 100 may be an organic interposer. The organic RDL 100 may be formed on the first carrier substrate 10. In one non-limiting example, the RDL 100 may be formed by sequentially depositing layers of a dielectric material 118, such as a dielectric polymer material, over the first side of the first carrier substrate 10 (and over the first release layer 117, if present). Each of the layers of dielectric material 118 may be lithographically patterned and etched to form open regions (e.g., trenches and/or via openings), and a metallization process may then be used to fill the open regions and form metal features 108 (e.g., metal lines and vias) within each successive layer of dielectric material 118. In this manner, the RDL 100 may be built layer-by-layer over the first side of the first carrier substrate 10.

In some embodiments, each of the layers of dielectric material 118 of the RDL 100 may include a suitable dielectric polymer material, such as polyimide (PI), benzocyclobutene (BCB), or polybenzobisoxazole (PBO). Other suitable dielectric materials are within the contemplated scope of disclosure. For example, non-limiting examples of the dielectric polymer materials having a Young's modulus greater than 10 GPa include glass-filled epoxy resin, mica-filled phenol formaldehyde, and other polymer materials including a strengthening filler material. The layers of dielectric material 118 of the RDL 100 may be formed using a suitable deposition process, such as a spin coating and drying process. Other suitable deposition processes are within the contemplated scope of disclosure.

The metal features 108 of the RDL 100 may be formed of a suitable conductive material, such as Cu, Ni, W, Cu, Co, Mo, Ru, etc., including alloys and combinations of the same. In some embodiments, the metal features 108 may include a metallic barrier layer, such as a layer of Ti, TiN, TaN, or WN, contacting the dielectric material 118, and a metallic fill material, which may include an elemental metal (e.g., Cu, Ni, etc.) or an alloy or a combination thereof. Other suitable materials for the metal features 108 of the RDL 100 are within the contemplated scope of disclosure. The metal features 108 of the RDL 100 may be formed using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), electrochemical deposition (e.g., electroplating), or combinations thereof.

Multiple interposers 100 may be formed on the first carrier substrate 10 an instance of an RDL 100 located on the first carrier substrate 10. For example, the first carrier substrate 10 may include a periodic two-dimensional array (such as a rectangular array) of interposers 100. The interposers 100 over the first carrier substrate 10 may be continuous with one another, such that a continuous layer of dielectric material 118 may extend across the first carrier substrate 10, with separate instances of metal features 108 formed within the continuous layer of dielectric material 118.

Figure 2:
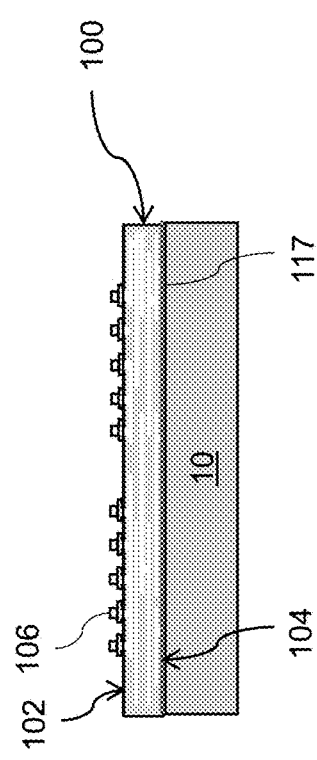
FIG. 2 is a vertical cross-section view of the intermediate structure showing bonding structures located over the first side of the interposer according to various embodiments of the present disclosure.

FIG. 2 is a vertical cross-section view of the intermediate structure showing bonding structures 106 located over the first side 102 of the RDL 100 according to various embodiments of the present disclosure. Referring to FIG. 2, the bonding structures 106 may include a plurality of metallic bumps. The bonding structures 106 may be formed by depositing one or more layers of a metal material and patterning the one or more layers of metal material to form the plurality of bonding structures 106 over the first side 102 of the RDL 100. Each bonding structure 106 may be electrically coupled to an underlying metal feature 108 of the RDL 100. In some embodiments, the bonding structures 106 may form at least one periodic two-dimensional array (such as a rectangular array) of bonding structures 106.

In various embodiments, the bonding structures 106 may be configured for subsequent micro-bump bonding (i.e., C2 bonding) to corresponding bonding structures formed on semiconductor integrated circuit (IC) dies. In some embodiments, the bonding structures 106 may include a plurality of metal pillars. The metal pillars may include copper or a copper-containing alloy. In some embodiments, the bonding structures may include a plurality of metal stacks, such as a plurality of Cu—Ni—Cu stacks. In some embodiments, the bonding structures 106 may include a solder material, such as tin or a tin-containing alloy, on an upper surface of the bonding structures 106. Other suitable materials and/or configurations for the bonding structures 106 are within the contemplated scope of disclosure.

Figure 3:
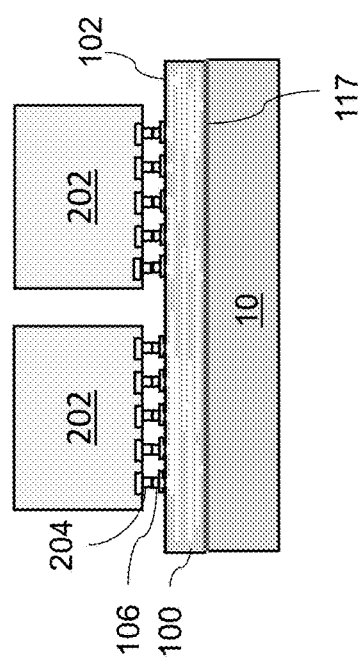
FIG. 3 is a vertical cross-section view of the intermediate structure showing a plurality of semiconductor integrated circuit (IC) dies mounted over the first side of the interposer according to various embodiments of the present disclosure.

FIG. 3 is a vertical cross-section view of the intermediate structure showing a plurality of semiconductor integrated circuit (IC) dies 202 (or semiconductor devices) mounted over the first side 102 of the RDL 100 according to various embodiments of the present disclosure. In some embodiments, the plurality of IC semiconductor dies 202 may include at least one system-on-chip (SoC) die. An SoC die may include, for example, an application processor die, a central processing unit die, and/or a graphic processing unit die. In some embodiments, the plurality of IC semiconductor dies 202 may include at least one memory die. The at least one memory die may include a high bandwidth memory (HBM) die. In some embodiments, an HBM die or a semiconductor device may include a vertical stack of interconnected memory dies. In some embodiments, the plurality of semiconductor IC dies 202 or semiconductor devices may be homogeneous, meaning that all of the semiconductor IC dies 202 may be of the same type (e.g., all SoC dies, all HBM dies, etc.). Alternatively, the plurality of semiconductor IC dies 202 may be heterogeneous, meaning that the plurality of semiconductor IC dies 202 may include different types of semiconductor IC dies 202 (e.g., at least one SoC die and at least one HBM die). In some embodiments, the plurality of semiconductor IC dies 202 may include one or more SoC dies and a plurality of HBM dies. Further, although two semiconductor IC dies 202 are shown mounted over the first side 102 of the RDL 100 in the exemplary embodiment of FIG. 3, it will be understood that in various embodiments more than two semiconductor IC dies 202 may be mounted over the first side 102 of the RDL 100.

Referring again to FIG. 3, each of the semiconductor IC dies 202 may include semiconductor die bonding structures 204 located over a lower surface of the semiconductor IC die 202. The semiconductor die bonding structures 204 on the semiconductor IC dies 202 may have a similar or identical configuration as the bonding structures 106 over the first side 102 of the RDL 100 described above with reference to FIG. 2. For example, the semiconductor die bonding structures 204 on the lower surfaces of the semiconductor IC dies 202 may include a plurality of metallic bumps, such as metal pillars and/or metal stacks. In some embodiments, the semiconductor die bonding structures 204 on the semiconductor IC dies 202 may include a solder material, such as tin or a tin-containing alloy, on the lower surface of the semiconductor die bonding structures 204. The semiconductor die bonding structures 204 on the lower surfaces of each semiconductor IC die 202 may be configured for micro-bump bonding (i.e., C2 bonding) to corresponding bonding structures 106 on the first side 102 of the RDL 100.

The semiconductor IC dies 202 may be mounted over the first side 102 of the RDL 100 by placing each of the semiconductor IC dies 202 over the first side 102 of the RDL 100 (e.g., using a pick-and-place apparatus). The semiconductor IC dies 202 may be aligned over the first side 102 of the RDL 100 such that the semiconductor die bonding structures 204 on the lower surfaces of the semiconductor IC dies 202 contact corresponding bonding structures 106 over the first side 102 of the RDL 100. A reflow process of the solder material may be used to bond the semiconductor die bonding structures 204 on the lower surfaces of the semiconductor IC dies 202 to the corresponding bonding structures 106 over the first side 102 of the RDL 100, thereby providing a mechanical and electrical connection between each of the semiconductor IC dies 202 and the RDL 100. In various embodiments, a plurality of semiconductor IC dies 202 may mounted over the first side 102 of the RDL 100.

Figure 4:
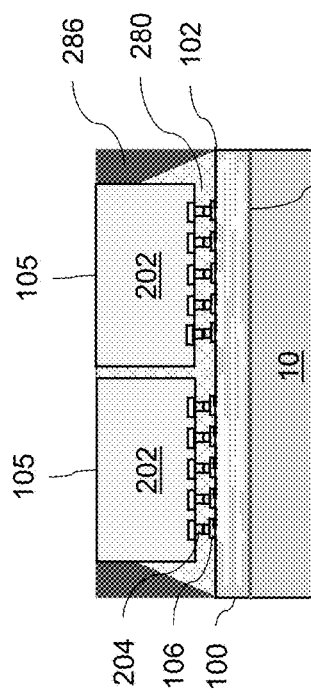
FIG. 4 is a vertical cross-section view of the intermediate structure showing a first underfill layer located between the lower surfaces of the semiconductor IC dies and the first side of the interposer, and a molding material around the outer periphery of the plurality of semiconductor IC dies according to various embodiments of the present disclosure.

FIG. 4 is a vertical cross-section view of the intermediate structure showing a first underfill layer 280 located between the lower surfaces of the semiconductor IC dies 202 and the first side 102 of the RDL 100, and a molding material 286 around the outer periphery of the plurality of semiconductor IC dies 202 according to various embodiments of the present disclosure. Referring to FIG. 4, the first underfill layer 280 may be applied into the spaces between the first side 102 of the RDL 100 and the plurality of semiconductor IC dies 202 mounted to the RDL 100. The first underfill layer 280 may laterally surround and contact each of the bonding structures 106 and semiconductor die bonding structures 204 that bond the respective semiconductor IC dies 202 to the RDL 100. The first underfill layer 280 may also be located between adjacent semiconductor IC dies 202 of the plurality of semiconductor IC dies 202 mounted to the RDL 100.

The first underfill layer 280 may include any underfill material known in the art. For example, the first underfill material 280 may be composed of an epoxy-based material, which may include a composite of resin and filler materials. Other suitable materials for the first underfill layer 280 are within the contemplated scope of disclosure. Any known underfill material application method may be used to apply the first underfill layer 280.

Referring again to FIG. 4, a molding material 286 may laterally surround the plurality of semiconductor IC dies 202 mounted to the RDL 100. The molding material 286 may contact lateral sides of at least some of the semiconductor IC dies 202 and may also contact the first underfill layer 280. In various embodiments, the molding material 286 may include an epoxy material. For example, the molding material 286 may include an epoxy mold compound (EMC) that may include epoxy resin, a hardener (i.e., a curing agent), silica or other filler material(s), and optionally additional additives. The EMC may be applied around the periphery of the semiconductor IC dies 202 in liquid or solid form, and may be hardened (i.e., cured) to form a molding material 286 having sufficient stiffness and mechanical strength surrounding the plurality of semiconductor IC dies 202. Portions of the molding material 286 that extend above a horizontal plane including the top surfaces of the semiconductor IC dies 202 may be removed using a planarization process, such as a chemical mechanical planarization (CMP) process.

Figure 5:
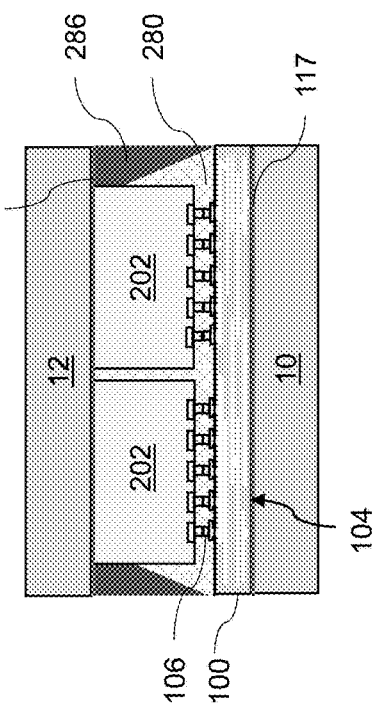
FIG. 5 is a vertical cross-section view of the intermediate structure showing a second release layer located over the upper surfaces of the plurality of semiconductor dies, the exposed upper surface of the first underfill layer and the exposed upper surface of the molding material, and a second carrier substrate over the second release layer according to various embodiments of the present disclosure.

FIG. 5 is a vertical cross-section view of the intermediate structure showing a second release layer 121 located over the upper surfaces 105 of the plurality of semiconductor dies 202, the exposed upper surface 105 of the first underfill layer 280 and the exposed upper surface of the molding material 286, and a second carrier substrate 12 over the second release layer 121 according to various embodiments of the present disclosure. Referring to FIG. 5, the second release layer 121 may include an adhesive material that may adhere the second carrier substrate 12 to the upper surfaces 105 of the plurality of semiconductor dies 202, the first underfill layer 280 and the molding material 286. As with the first release layer 117 described above, the second release layer 121 may also be configured to lose its adhesive properties when subjected to a treatment using an energy source, such as a thermal, optical (e.g., UV, laser, etc.) and/or sonic (e.g., ultrasonic) energy source. In some embodiments, the first release layer 117 and the second release layer 121 may be composed of the same material(s). Alternatively, the first release layer 117 and the second release layer 121 may be composed of different material(s).

The second carrier substrate 12 may be formed of a suitable substrate material, such as the materials described above with reference to the first carrier substrate 10 shown in FIG. 1. In some embodiments, the second carrier substrate 12 may be composed of the same material(s) as the first carrier substrate 10. Alternatively, the second carrier substrate 12 and the first carrier substrate 10 may be composed of different material(s).

Figure 6:
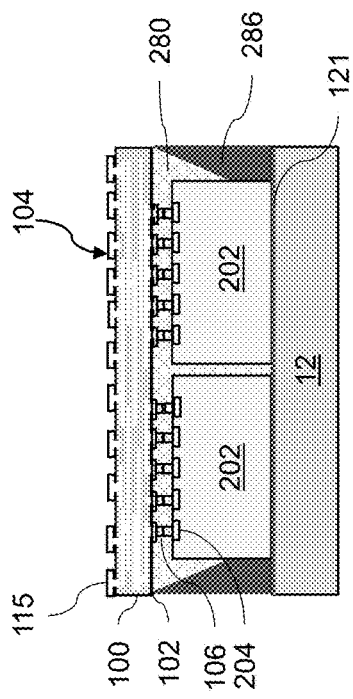
FIG. 6 is a vertical cross-section view of the intermediate structure showing the first carrier substrate removed according to various embodiments of the present disclosure.

FIG. 6 is a vertical cross-section view of the intermediate structure showing the first carrier substrate 10 removed according to various embodiments of the present disclosure. Referring to FIG. 6, the first carrier substrate 10 may be removed using any suitable method known in the art. In embodiments in which the first carrier substrate 10 is adhered to the RDL 100 by a first release layer 117, the first release layer 117 may be subjected to a treatment that causes the first release layer 117 to lose its adhesive properties. This may enable the first carrier substrate 10 to be separated from the exemplary intermediate structure. For example, the first release layer 117 may include a light-to-heat conversion (LTHC) material that may be irradiated by optical radiation in a specified wavelength range, such as ultraviolet radiation, causing the LTHC material to heat up and thereby lose adhesion. The first release layer 117 may optionally be irradiated through the first carrier substrate 10 in embodiments in which the first carrier substrate 10 is composed of an optically-transparent material. Alternatively, the first release layer 117 may include a thermally-decomposing adhesive material. The exemplary intermediate structure be subjected to a thermal anneal process at a debonding temperature sufficient to cause the first release layer 117 to decompose and thereby enable the first carrier substrate 10 to be detached from the exemplary intermediate structure. In embodiments in which a thermal anneal process is used to remove the first carrier substrate 10, the debonding temperature used to thermally decompose the first release layer 117 may not be sufficient cause the second release layer 121 to lose its adhesive properties.

The exemplary intermediate structure may be inverted (i.e., flipped over), either prior to or following the removal of the first carrier substrate 10, such that the RDL 100 may be located over and supported by the second carrier substrate 12. Bonding pads 115 may be formed over the second side 104 of the RDL 100.

Figure 7A:
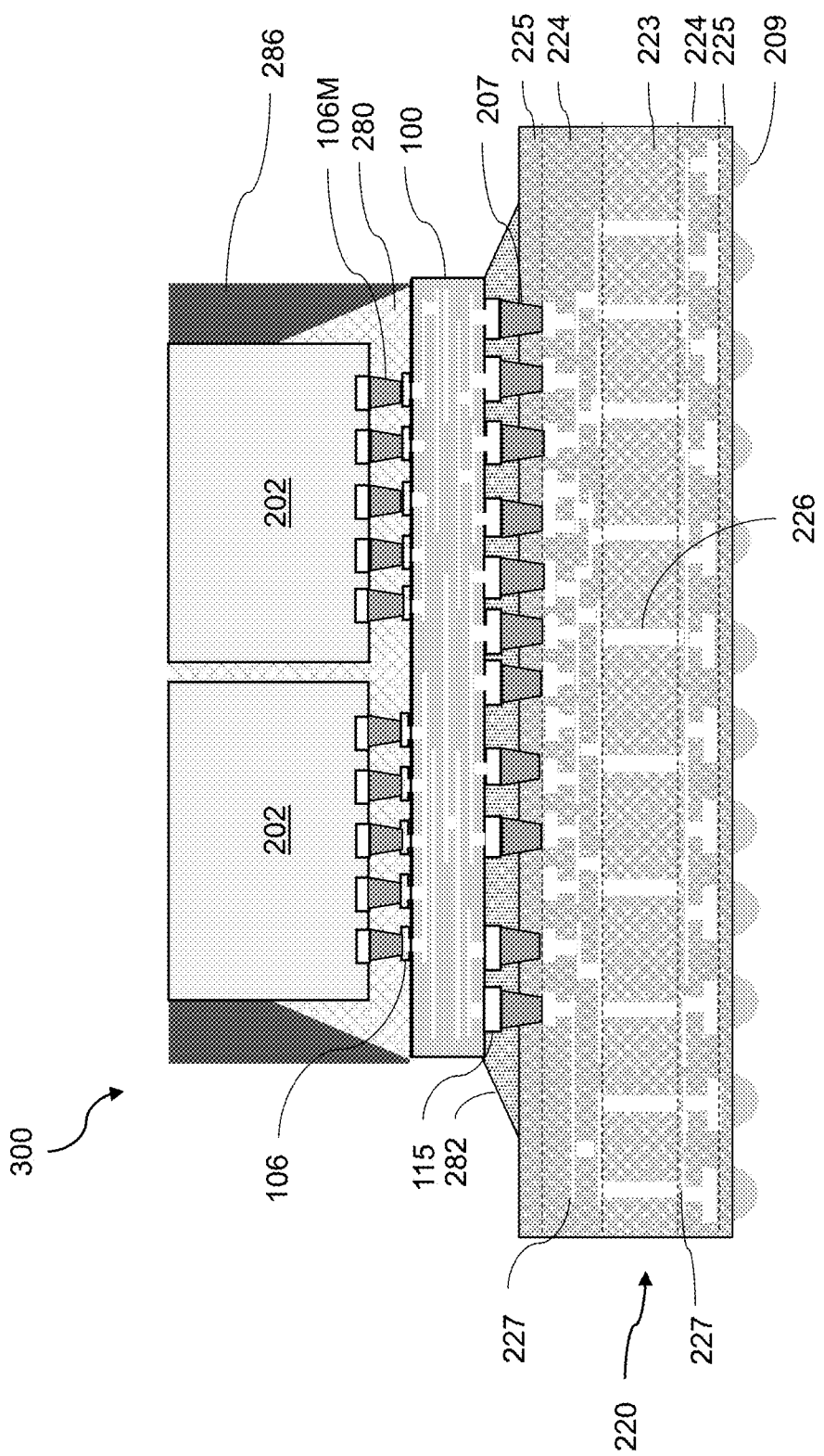
FIG. 7A is a vertical cross-section view of a semiconductor package including the intermediate structure of FIG. 6, according to various embodiments of the present disclosure.

FIG. 7A is a vertical cross-section view of a semiconductor package 300 including the intermediate structure of FIG. 6, according to various embodiments of the present disclosure. Referring to FIG. 7A, the intermediate structure of FIG. 6 may be inverted and attached to a package substrate 220 by solder balls 207 (e.g., C4 bumps).

A second underfill layer 282 may be applied around the solder balls 207. The second underfill layer 282 may be formed by similar methods and using similar materials as the first underfill layer 280. In other embodiments, the second underfill layer 282 may be formed by different methods and/or using different materials as the first underfill layer 280. In various embodiments, the package substrate 220 may include metal features 227 (e.g., metal lines, vias, bonding regions, etc.) extending within the package substrate 220. In some embodiments, the package substrate 220 may be configured to be mounted to a supporting substrate, such as a printed circuit board (PCB). Electrical connections between the supporting substrate (e.g., a PCB) and the semiconductor package may be made via the redistribution structures 224 within the package substrate 220.

In some embodiments, the package substrate 220 may include a multi-layer structure including a substrate core 223, at least one redistribution layer 224, and at least one outer coating layer 225. For example, the package substrate 220 may include a pair of redistribution layers 224 located above and below the substrate core 223. The substrate core 223 may be a plate-like member composed of a suitable material such as an epoxy resin, glass, and/or ceramic material. The substrate core 223 may include a plurality of conductive via structures 226 extending through the substrate core 223. The redistribution layers 224 may include metal features 227, such as metal lines, vias, and bonding regions, embedded in a dielectric material matrix. In some embodiments, the dielectric material matrix may include multiple layers of a dielectric material, such as a photosensitive epoxy material. Each layer of dielectric material may be lithographically patterned to form open regions (e.g., trenches and via openings) within the respective layers of dielectric material. A metallization process may be used to fill the open regions with a suitable conductive material, such as copper or a copper-alloy, within each layer of dielectric material to form the metal features 227 embedded within the dielectric material matrix. The outer coating layers 225 of the package substrate 220 may include a layer of solder resist material formed over the respective redistribution layers 224. Each of the layers of solder resist material may provide a protective coating for the package substrate 220 and the underlying metal features 227 within the package substrate 10. An outer coating layer 225 formed of solder resist material may also be referred to as a "solder mask." An array of solder joints 209 may be formed to bond the array of underlying metal features 227 to the array of a subsequently mounted substrate such as a printed circuit board (PCB). The solder joints 209 may be formed by disposing an array of solder balls between the array of underlying metal features 227.

Other suitable configurations for the package substrate 220 are within the contemplated scope of disclosure.

In some embodiments, the semiconductor package 300 may include a single semiconductor die 202, or more than two semiconductor dies 202, which may have the same or different functions. In some embodiments, the semiconductor dies 202 may include stacked semiconductor chips.

Stress Reduction Components

The heating and cooling of semiconductor devices may result in the generation of thermo-mechanical stress, due to coefficient of thermal expansion (CTE) differences between device components. For example, CTE differences between semiconductor dies and the underlying package substrates may generate thermo-mechanical stress, which may be concentrated in certain locations within a semiconductor device. Excessive thermo-mechanical stress may result in a reduction in device reliability, due to the generation of cracks and/or other types of stress-related damage. Accordingly, as described in detail below, various embodiments of the present disclosure may include stress buffers configured to reduce thermo-mechanical stress applied to semiconductor package components.

FIG. 7B is a top view of the semiconductor package 300 of FIG. 7A. FIG. 8A is a partial cross-sectional view taken along line L1 of FIG. 7B. Referring to FIGS. 7B and 8A, stress buffers 250 may be formed below regions of the first underfill layer 280 that are subject to relatively high amounts of thermo-mechanical stress. For example, the stress buffers 250 may be embedded into corner regions of the RDL 100. In particular, the stress buffers 250 may be rectangular layers formed in the RDL 100. The stress buffers 250 may directly contact the first underfill layer 280. In other words, the stress buffers 250 may be disposed directly between the first underfill layer 280 and the RDL 100.

The stress buffers 250 may be formed of flexible materials, such that the stress buffers 250 have a first Young's modulus that is lower than a second Young's modulus of the RDL 100 and/or a third Young's modulus of the first underfill layer 280. For example, the stress buffers 250 may have a first Young's modulus that is at least 30% less than the second Young's modulus of the RDL 100 and/or the third Young's modulus of the first underfill layer 280. In some embodiments, the stress buffers 250 may have a first Young's modulus ranging from about 0.25 to 3 GPa, such as from 0.5 to 2 GPa. Non-limiting examples of the dielectric polymer materials having a Young's modulus greater than 10 GPa and that may be included in the dielectric material 118 include glass-filled epoxy resin, mica-filled phenol formaldehyde, and other polymer materials including a strengthening filler material.

The stress buffers 250 may be formed of flexible polymer materials, such as epoxy-based materials, silicon-based materials, or the like. For example, the stress buffers 250 may be formed of polyimide, polyurethane, polybenzoxazole (PBO), or silicon-based materials, having a Young's modulus ranging from about 0.25 to 3 GPa, such as from 0.5 to 2 GPa. In some embodiments, silicon-based materials may be preferred as a material of the stress buffers 250.

The stress buffers 250 may be rectangular structures have a dimension LW (e.g., a length or width) ranging from 500 μm to 3000 μm, such as from 300 μm to 2000 μm. In other words, the stress buffers 250 may have rectangular or square-shaped perimeters. However, the stress buffers 250 are not limited to any particular shape. The stress buffers 250 may extend outside the perimeter of an overlapping semiconductor die 202 by a first distance D1, and may extend under the semiconductor die 202 by a second distance D2. The first distance D1 and the second distance D2 may independently range from 200 μm to 1500 μm, such as from 150 μm to 1000 μm.

The stress buffers 250 may have a thickness T ranging from 5 μm to 200 μm, such as from 10 μm to 1000 μm. As shown in FIG. 8A, in some embodiment the thickness T may be less than the thickness of the RDL 100.

FIG. 8B is a cross-sectional view showing a modified stress buffer 250', that may be included in the semiconductor package 300, according to various embodiments of the present disclosure. Referring to FIG. 8B, the stress buffer 250' may have a thickness T1 that is greater than the thickness T of the stress buffer 250. For example, the thickness T1 may be equal to the thickness of the RDL 100. In other words, the stress buffer 250' may directly contact the first underfill layer 280 and the second underfill layer 282.

Figure 9A:
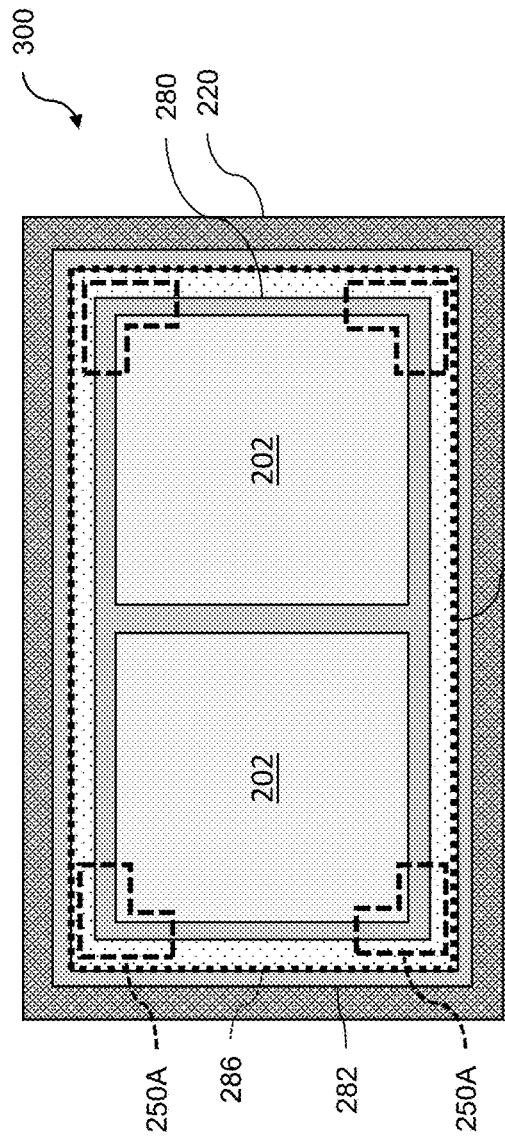
FIGS. 9A-9D are top views of semiconductor packages 300 including alternative stress buffers, according to various embodiments of the present disclosure.
Figure 9B:
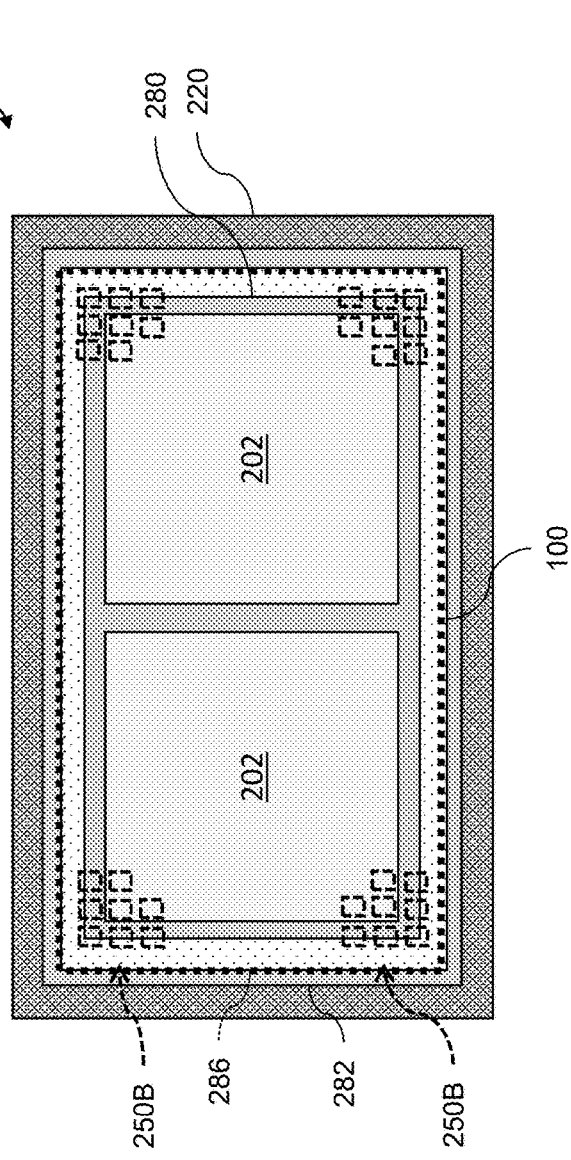
Figure 9C:
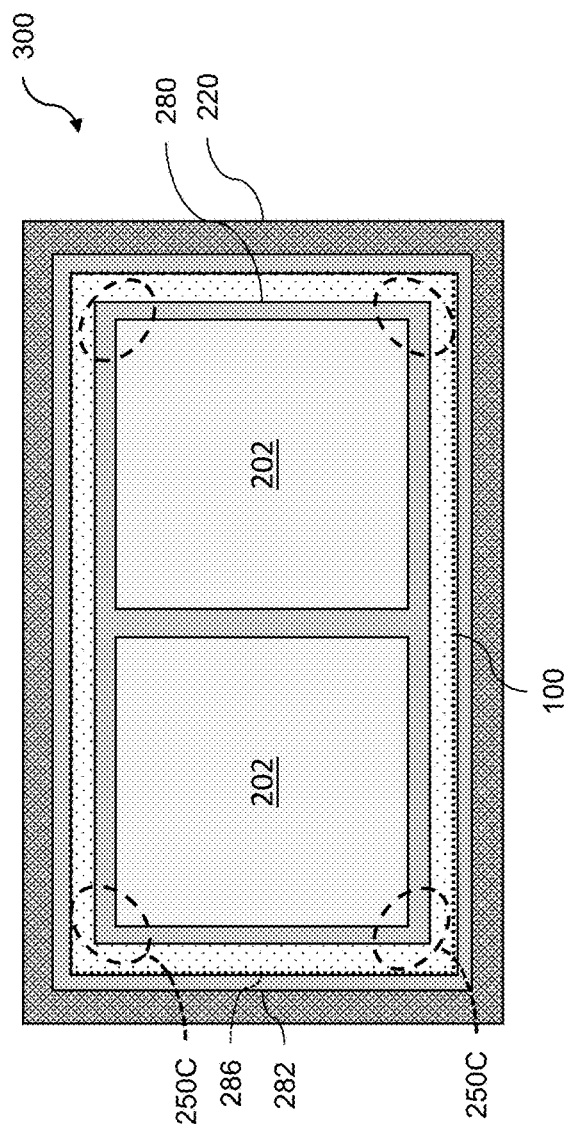
Figure 9D:
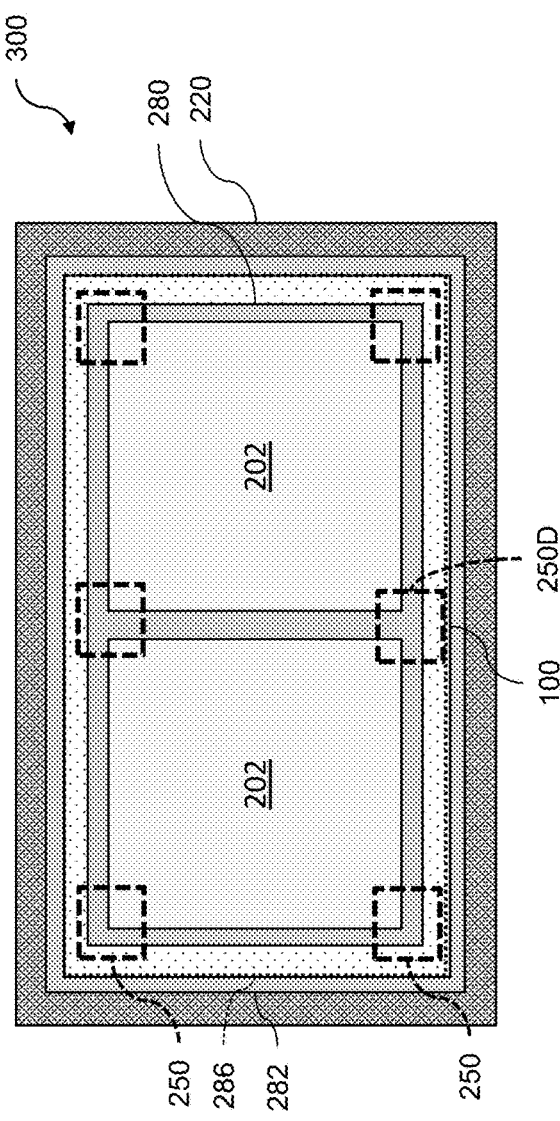

FIGS. 9A-9D are top views of semiconductor packages 300 including alternative stress buffers 250A, 250B, 250C, and 250D, according to various embodiments of the present disclosure. Referring to FIG. 9A, the stress buffers 250A may have L-shaped perimeters. As shown in FIG. 9B, the multiple stress buffers 250B may be disposed in arrays adjacent to corners of the semiconductor die 202 and corresponding corners of the RDL 100. Referring to FIG. 9C, the stress buffers 250C may have an ovoid or circular perimeter. Referring to FIG. 9D, additional stress buffers 250D may be disposed below adjacent corners of the semiconductor dies 202.

During operation, it has been observed thermo-mechanical stress may accumulate during heating and cooling of the semiconductor package. For example, thermo-mechanical stress may accumulate at peripheral corners of the semiconductor dies 202. It is believed that the thermo-mechanical stress may result from a coefficient of thermal expansion (CTE) differences between the semiconductor dies 202 and the package substrate 220. In many instances, cracks may develop in the first underfill layer 280 and may propagate into the molding material/encapsulant 286. As such, the thermo-mechanical stress may reduce the long-term reliability of the semiconductor package 300. The stress buffers 250 strategically positioned in the peripheral corners of the semiconductor dies 202 may mitigate against the thermo-mechanical stress.

Figure 10:
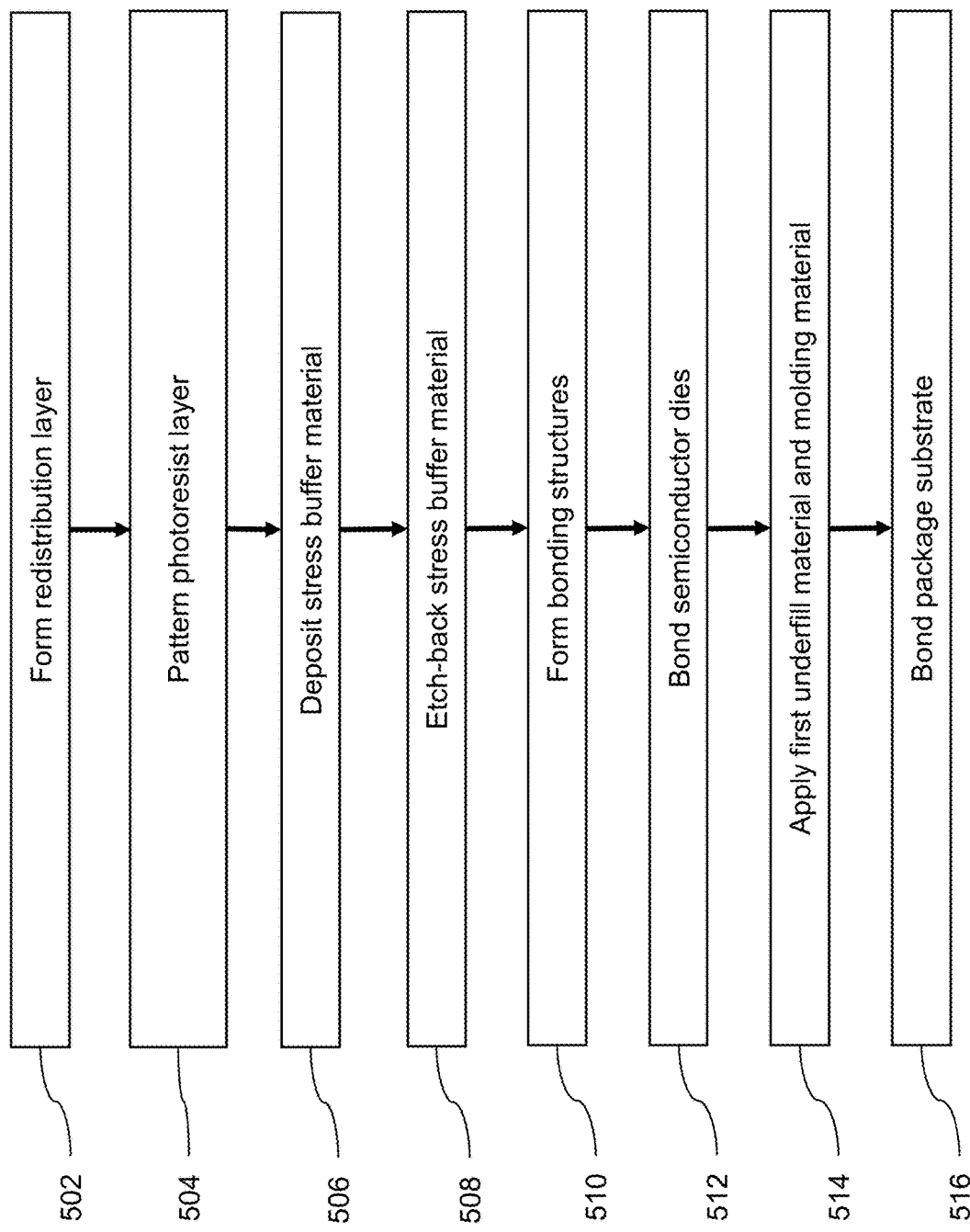
FIG. 10 is a flow diagram showing operation of a method of forming a semiconductor package, according to various embodiments.
Figure 11A:
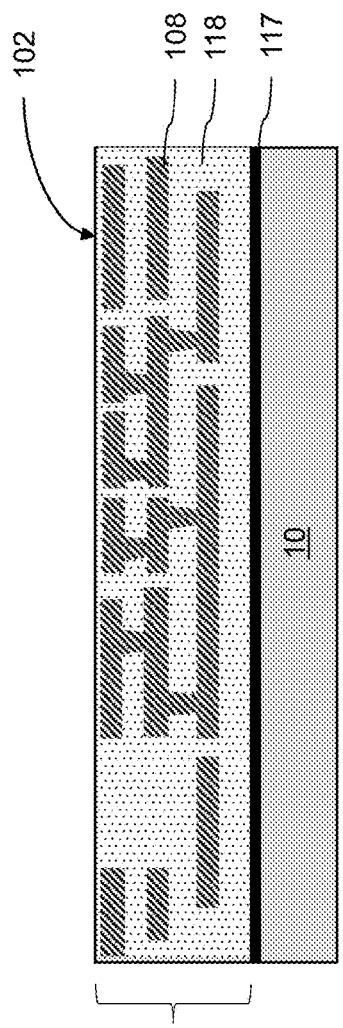
FIGS. 11A-11H are vertical cross-sectional views illustrating process flow steps of the method of FIG. 10.
Figure 11B:
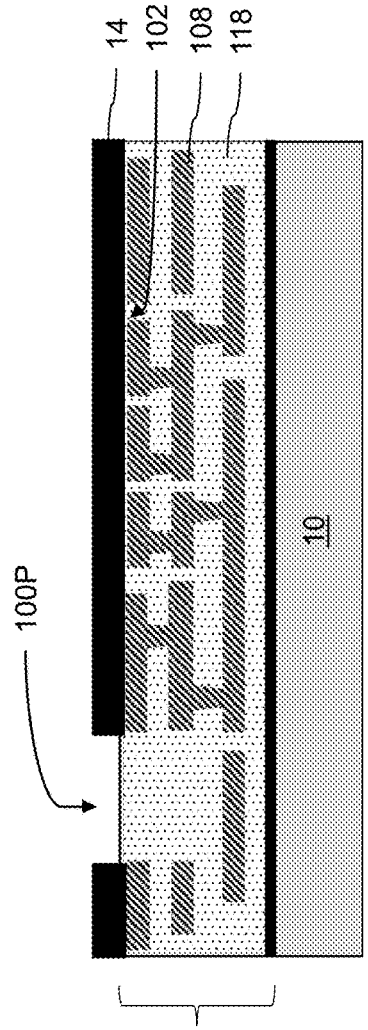
Figure 11C:
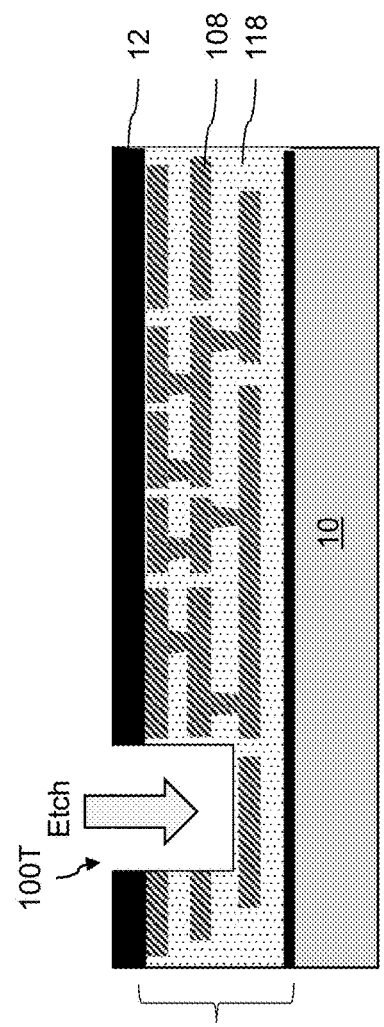
Figure 11D:
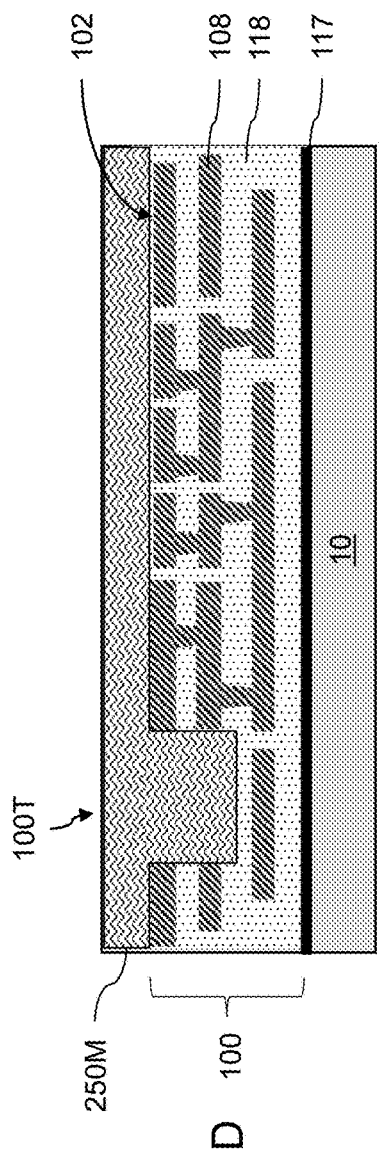
Figure 11E:
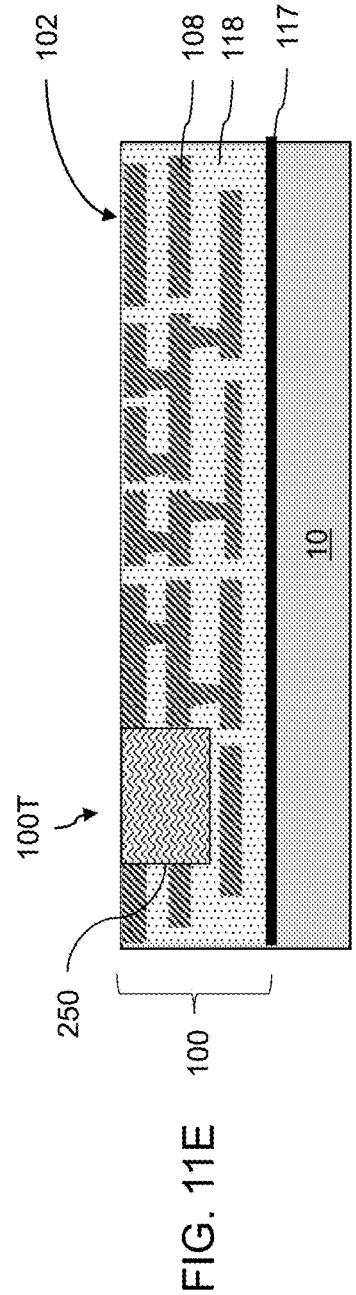
Figure 11F:
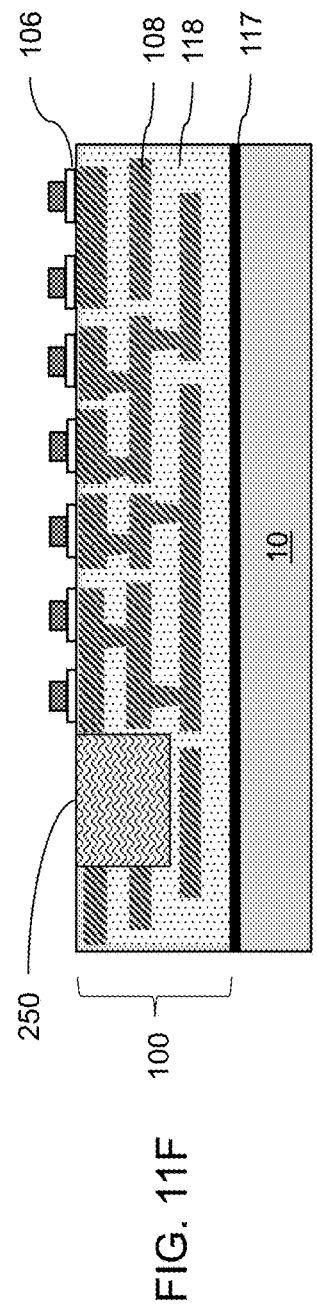
Figure 11G:
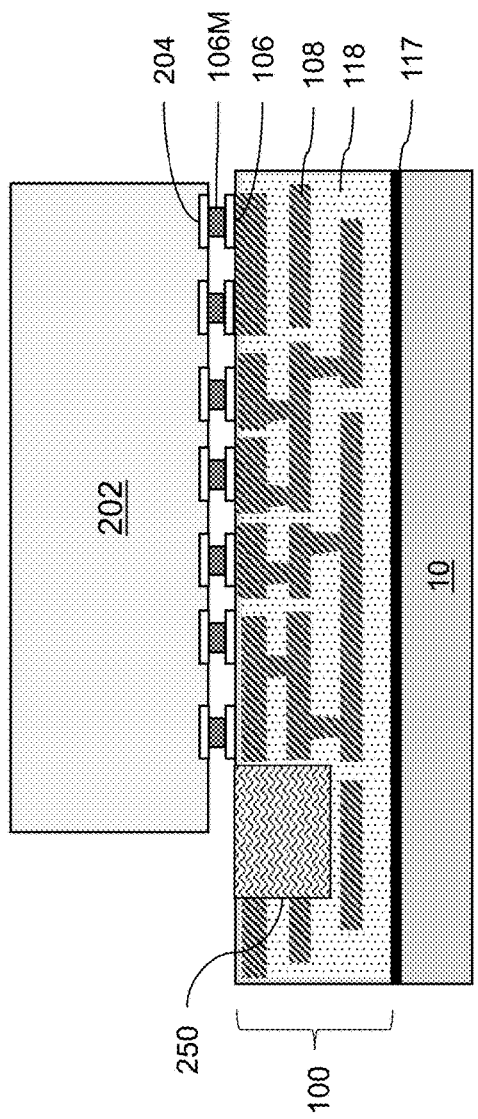
Figure 11H:
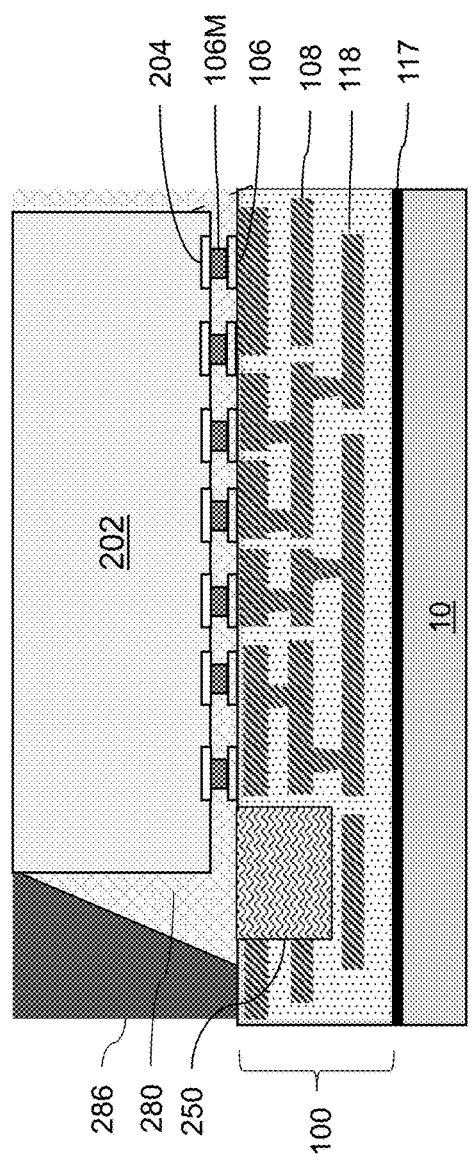

FIG. 10 is a flow diagram showing the operations of a method of forming an RDL 100 including stress buffers, according to various embodiments of the present disclosure. FIGS. 11A-11H are cross-sectional views illustrating the operations of FIG.

Referring to FIGS. 10 and 11A-11H, in operation 502 an RDL 100 may be formed on a carrier substrate 10. The RDL 100 may be formed by any suitable method, such as by sequentially depositing layers of a dielectric material 118, such as an organic polymer material, over the front side of the first carrier substrate 10 (and over the first release layer 117, if present). Each of the layers of dielectric material 118 may be lithographically patterned and etched to form open regions (e.g., trenches and/or via openings), and a metallization process (such as sputtering and/or electro-deposition) may then be used to fill the open regions and form metal features 108 (e.g., metal lines and vias) within each successive layer of dielectric material 118. In this manner, the RDL 100 may be built layer-by-layer over the front side of the first carrier substrate 10.

In operation 502, a patterned photoresist layer 14 may be formed on the first side 102 of the RDL 100. The RDL may including openings that expose portions 100P of the RDL 100. The exposed portions 100P may be portions of the RDL 100 that are consistent with vacancies in the RDL 100 of one or more layers of the metal features 108. For example, the metal features 108 may be absent from one or more upper layers of the RDL 100 in the exposed portions 100P, or the metal features 108 may be completely absent from the exposed portions 100P.

In operation 504, the RDL 100 may be etched, using the photoresist layer 14 as a mask, to form trenches 100T in the RDL 100. The trenches 100T may extend partially or completely through the RDL 100.

In operation 506, a stress buffer material 250M may be deposited on the RDL 100 and in the upper surface 102 of the RDL 100 and in the trenches 100T. In some embodiments, the stress buffer material 250M may be applied as a liquid, and then cured using heat or UV light, for example.

In operation 508, an etch-back process may be performed to remove the stress buffer material 250M overburden from the upper surface 102 of the RDL 100. Accordingly, the stress buffers 250 may be formed in the trenches 100T.

In operation 510, bonding structures 106 may be formed on the upper surface 102 of the RDL 100. The bonding structures 106 may be electrically connected to the metal features 108.

In operation 512, one or more semiconductor dies 202 may be bonded to the RDL 100. In particular, the semiconductor dies 202 may be aligned with the RDL 100, such that bonding structures 204 of the semiconductor dies 202 are aligned with the bonding structures 106 of the RDL 100. In particular, the stress buffers 250 may be configured to operate as alignment marks for alignment of the semiconductor die 202. The bonding structures 106 may include micro-bumps 106M of a solder material.

In operation 514, a first underfill layer 280 may be applied between the semiconductor dies 202 and the RDL 100, and then cured. A molding material 286 may then be applied to the structure and cured.

In operation 516, the semiconductor device may be attached to a package substrate 220, as shown in FIGS. 5-7. In particular, the first carrier 10 may be removed, the semiconductor die 202 may be inverted and disposed on a second carrier 12, soldier balls 207 may be formed on the RDL 100, the RDL 100 may be bonded to the package substrate 220, the second bonding layer 12 may be removed, and a second underfill layer 282 may be formed.

Referring to all drawings and according to various embodiments of the present disclosure, a semiconductor package 300 may be provided that may include: a package substrate 220; a semiconductor die or device 202 vertically stacked on the package substrate 220; a redistribution layer (RDL) or interposer 100 comprising a dielectric material 118 and metal features 108 that electrically connect the semiconductor die 202 to the package substrate 220, the RDL or interposer 100 having a first Young's modulus; a first underfill layer 280 disposed between the RDL or interposer 100 and the semiconductor die 202; and a stress buffer 250, 250' embedded in the RDL or interposer 100 below a corner of the semiconductor device 202, the stress buffer 250 having a second Youngs modulus that is at least 30% less than the first Youngs modulus.

In various embodiments, the stress buffer 250, 250' is disposed between the RDL 100 and the corner of the semiconductor die 202. In various embodiments, the stress buffer 250, 250' extends horizontally outside of a perimeter of the semiconductor die 202, by a distance ranging from 150 μm to 1000 μm. In some embodiments, the stress buffer 250, 250' has a thickness that is less than or equal to a thickness of the RDL 100. In one embodiment, the stress buffer 250 has a thickness ranging from 10 μm to 1000 μm. In one embodiment, the second Young's modulus may range from 0.5 GPa to 2 GPa. In some embodiments, the first underfill layer 280 has a third Young's modulus that is greater than the second Young's modulus. In some embodiments, the stress buffer 250, 250' may include a silicon-based material; and the dielectric material include an epoxy-based material. In some embodiments, the stress buffer 250, 250' may have a rectangular, L-shaped, or ovoid horizontal cross-sectional profile. In one embodiment, the stress buffer 250, 250' may be arranged as part of an array below the corner of the semiconductor die. In various embodiments, the stress buffers 250, 250' may be configured to reduce an amount of thermo-mechanical stress that is applied to the first underfill layer 280.

According to another aspect of the present disclosure, a semiconductor package 300 is provided, wherein the semiconductor package 300 may include a package substrate 220; a semiconductor die 202 vertically stacked on the package substrate 220; a redistribution layer (RDL) 100 comprising a dielectric material 118 and metal features 108 that electrically connect the semiconductor die 202 to the package substrate 220, the RDL 100 having a first Young's modulus; a first underfill layer 280 disposed between the RDL 100 and the semiconductor die 202; and a stress buffer 250, 250' embedded in a top surface of the RDL 100 below a corner of the semiconductor die 202, the stress buffer 250, 250' having a second Young's modulus that is at least 30% less than the first Young's modulus.

Various embodiments further provide a method of manufacturing a semiconductor package 300, comprising: forming a redistribution layer (RDL) 100 comprising a dielectric material 118 and metal features 108; etching a first side 102 of the RDL 100 to form a trench 100T; depositing a stress buffer material 250M on the first side 102 of the RDL 100 and in the trench 100T; etching back the stress buffer material 250M to form a stress buffer 250, 250' in the trench; aligning the semiconductor die 202 on the first side of the RDL 100, such that the stress buffer 250, 250' is disposed below a corner of the semiconductor die 202; bonding the aligned semiconductor die 202 to the RDL 100; forming a first underfill layer 280 between the semiconductor die 202 and the RDL 100; and bonding a package substrate 220 to a second side 104 of the RDL 100, wherein the RDL 100 has a first Young's modulus and the stress buffer 250, 250' has a second Young's modulus that is at least 30% less than the first Young's modulus.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a package substrate comprising redistribution structures configured to electrically connect the semiconductor package to a supporting substrate;
a semiconductor device vertically stacked on the package substrate;
an interposer comprising a dielectric material and metal features that electrically connect the semiconductor device to the package substrate, the dielectric material of the interposer having a first Young's modulus;

a first underfill layer disposed between the interposer and the semiconductor device; and a stress buffer embedded in the interposer below a corner of the semiconductor device in a top view and directly contacting the first underfill layer, the stress buffer having a second Young's modulus that is at least 30% less than the first Young's modulus.

2. The semiconductor package of claim 1, wherein the stress buffer is disposed between the interposer and the corner of the semiconductor device.

3. The semiconductor package of claim 2, wherein the stress buffer extends horizontally outside of a perimeter of the semiconductor device, by a distance ranging from 150 µm to 1000 µm.

4. The semiconductor package of claim 2, wherein the stress buffer extends horizontally inside of a perimeter of the semiconductor device, by a distance ranging from 150 µm to 1000 µm.

5. The semiconductor package of claim 1, wherein the stress buffer has a thickness that is less than a thickness of the interposer.

6. The semiconductor package of claim 5, wherein the thickness of the stress buffer ranges from 10 µm to 1000 µm.

7. The semiconductor package of claim 1, wherein the stress buffer has a thickness that is equal to a thickness of the interposer.

8. The semiconductor package of claim 1, wherein the second Young's modulus ranges from 0.5 GPa to 2 GPa.

9. The semiconductor package of claim 8, wherein the first underfill layer has a third Young's modulus that is greater than the second Young's modulus.

10. The semiconductor package of claim 1, wherein:
the stress buffer comprises a silicon-based material; and
the dielectric material comprises an epoxy-based material.

11. The semiconductor package of claim 1, wherein the stress buffer has rectangular, L-shaped, or ovoid horizontal cross-sectional profile.

12. The semiconductor package of claim 11, wherein the stress buffer is arranged as part of an array below the corner of the semiconductor device.

13. The semiconductor package of claim 1, wherein the stress buffer is configured to reduce an amount of thermomechanical stress that is applied to the first underfill layer.

14. A semiconductor package comprising:
a package substrate comprising redistribution structures configured to electrically connect the semiconductor package to a supporting substrate;
a semiconductor die vertically stacked on the package substrate;
a redistribution layer (RDL) comprising a dielectric material and metal features that electrically connect the semiconductor die to the package substrate, the RDL having a first Young's modulus;
a first underfill layer disposed between the RDL and the semiconductor die; and
a stress buffer embedded in a top surface of the RDL below a corner of the semiconductor die in a top view and directly contacting the first underfill layer, the stress buffer having a second Young's modulus that is at least 30% less than the first Young's modulus.

15. The semiconductor package of claim 14, wherein the stress buffer is disposed only below the corner of the semiconductor die that is adjacent to a corner of the RDL.

16. The semiconductor package of claim 14, wherein the first underfill layer has a third Young's modulus that is at least 30% greater than the second Young's modulus.

17. The semiconductor package of claim 14, wherein the stress buffer has a thickness that is less than or equal to a thickness of the RDL.

18. The semiconductor package of claim 16, wherein:
the second Young's modulus ranges from 0.5 GPa to 2 GPa;
the stress buffer comprises a silicon-based material; and
the dielectric material comprises an epoxy-based material.

19. A semiconductor package comprising:
a package substrate comprising redistribution structures configured to electrically connect the semiconductor package to a supporting substrate;
a first semiconductor device and a second semiconductor device disposed on the package substrate;
a first underfill layer disposed under the first and second semiconductor devices;
an interposer disposed under the first underfill layer and comprising a dielectric material and metal features that electrically connect the first semiconductor device and the second semiconductor device to the package substrate, the dielectric material having a first Young's modulus; and
stress buffers embedded in the interposer below first and second corners of at least one of the first semiconductor device or the second semiconductor device in a top view and directly contacting the first underfill layer, the stress buffers having a second Young's modulus that is at least 30% less than the first Young's modulus.

20. The semiconductor package of claim 19, wherein the stress buffers comprise multiple stress buffers disposed below at least one of the first corner or the second corner of the at least one of first semiconductor device or the second semiconductor device.

* * * * *